(12) United States Patent
Abramovici et al.

(10) Patent No.: US 6,874,108 B1
(45) Date of Patent: Mar. 29, 2005

(54) FAULT TOLERANT OPERATION OF RECONFIGURABLE DEVICES UTILIZING AN ADJUSTABLE SYSTEM CLOCK

(75) Inventors: Miron Abramovici, Berkeley Heights, NJ (US); John M. Emmert, Dayton, OH (US); Charles E. Stroud, Charlotte, NC (US)

(73) Assignees: Agere Systems Inc., Allentown, PA (US); University of North Carolina at Charlotte, Charlotte, NC (US)

( * ) Notice: Subject to any disclaimer, the term of this patent is extended or adjusted under 35 U.S.C. 154(b) by 422 days.

(21) Appl. No.: 10/228,444

(22) Filed: Aug. 27, 2002

Related U.S. Application Data
(60) Provisional application No. 60/315,096, filed on Aug. 27, 2001.

(51) Int. Cl.[7] .............................. G01R 31/28; G06F 1/12
(52) U.S. Cl. ........................ 714/725; 714/733; 713/401
(58) Field of Search .............................. 714/3, 4, 5, 7, 714/8, 10, 47, 48, 55, 725, 733, 734, 735, 736, 738, 742, 798, 799, 811, 815; 713/500, 400, 401

(56) References Cited

U.S. PATENT DOCUMENTS
| | | | | |
|---|---|---|---|---|
| 5,991,900 A | * | 11/1999 | Garnett ......................... | 714/56 |
| 6,718,496 B1 | * | 4/2004 | Fukuhisa et al. ........... | 714/733 |
| 6,802,023 B2 | * | 10/2004 | Oldfield et al. ................ | 714/7 |

OTHER PUBLICATIONS

"1994 ACM Second International Workshop on Field Programmable Gate Arrays," Feb. 13–15, 1994, Berkeley, California.

Jason L. Kelly; Peter A. Ivey, "A Novel Approach to Defect Tolerant Design for SRAM Based FPGAs," University of Sheffield, Mappin Street. Sheffield, S1 3JD, United Kingdom.

John M. Emmert; Dinesh Bhatia, "Partial Reconfiguration of FPGA Mapped Designs with Applications to Fault Tolerance and Yield Enhancement," Aug. 28, 2002, Design Automation Laboratory, P.O. Box 210030 ECECS Department, University of Cincinnati, Cincinnati, OH 45221–0030, pps. 15–33.

Fran Hanchek; Shantanu Dutt, "Methodologies for Tolerating Cell and Interconnect Faults in FPGAs," IEEE Transactions on Computers, vol. 47, No. 1, Jan. 1998, pps. 15–33.

John Lach; William H. Mangione–Smith; Miodrag Potkonjak, "Efficiently Supporting Fault–Tolerance in FPGAs," FPGA 98, Monterey, California, pps. 105–115.

* cited by examiner

Primary Examiner—Christine T. Tu
(74) Attorney, Agent, or Firm—King & Schickli, PLLC

(57) ABSTRACT

A method of fault tolerant operation of an adaptive computing system includes identifying a faulty resource in a signal path of the adaptive computing system, reconfiguring the signal path to avoid the faulty resource, estimating a time delay created by reconfiguring the signal path, and adjusting a system clock period to accommodate the time delay. In a preferred embodiment, an FPGA is configured into an initial self-testing area and a working area. Resources located within the self-testing area are tested and faulty resources identified. The FPGA is then reconfigured to avoid the identified faulty resources. When the resources are reconfigured for fault tolerant operation, signal path delays may be introduced into the system. If the signal path delays are in a critical path, a period of a system clock may be adjusted in order to insure proper fault tolerant operation.

23 Claims, 4 Drawing Sheets

FAULT TOLERANT OPERATION OF RECONFIGURABLE DEVICES UTILIZING AN ADJUSTABLE SYSTEM CLOCK

This application claims the benefit of U.S. Provisional Application No. 60/315,096, filed Aug. 27, 2001.

This invention was made with Government support under contract number F33615-98-C-1318. The Government has certain rights in this invention.

TECHNICAL FIELD

The present invention relates generally to the field of integrated circuit devices and, more particularly, to fault tolerant operation of reconfigurable devices such as field programmable gate array devices.

BACKGROUND OF THE INVENTION

A field programmable gate array (FPGA), whether alone, or forming an embedded portion of a system-on-chip or other application specific integrated circuit, is a type of integrated circuit consisting of an array of programmable logic blocks interconnected by a programmable interconnect or routing network and programmable input/output cells. Programming of the logic blocks, the interconnect resources which make up the network, and the input/output cells is selectively completed to make the necessary interconnections that establish one configuration thereof to provide the desired system operation/function for a particular application. The programmability and inherent redundancy of these reconfigurable hardware devices allows for fault tolerant operation of the devices in adaptive computing systems.

The present inventors have recently developed off-line methods of built-in self-testing the array of programmable logic blocks and the programmable interconnect resources in FPGAs at the device, board and system levels. These methods are set out in detail in U.S. Pat. Nos. 5,991,907, 6,003,150, 6,108,806, and 6,202,182. In addition to these off-line testing methods, the present inventors have also recently developed methods of testing programmable logic blocks and interconnect resources, including spares, and identifying faulty programmable logic blocks and interconnect resources during normal on-line operation of FPGAs, and fault tolerant operation. These testing, identifying, and fault tolerant operating methods are set out in detail in U.S. Pat. No. 6,256,758 and in pending U.S. application Ser. Nos. 09/405,958, 09/671,853, 09/406,219, 09/611,449, and in 10/189,640. The full disclosures in this patent and these patent applications are incorporated herein by reference.

On-line testing and fault tolerant operation of FPGAs is most important in high-reliability and high-availability applications, such as, long-life space missions, telecommunication network routers, or remote equipment in which adaptive computing systems often rely on reconfigurable hardware to adapt system operation to environment changes. In such applications, the adaptive computing systems and reconfigurable hardware must work continuously and simply cannot be taken off-line for testing, maintenance, or repair.

When faults are detected in the resources of these systems, the faulty resources must be quickly identified in order to facilitate efficient reconfiguration of the remaining resources to avoid the faulty resources or preferably to reuse the faulty resources for fault-tolerant operation of the reconfigurable hardware. When the resources are reconfigured for fault tolerant operation, propagation delays along the signal paths may be introduced into the system due. If the propagation delays are in a critical path, a period of a system clock may require adjustment in order to insure proper fault tolerant operation of the reconfigurable hardware. Rather than initially establishing and operating a system clock at a minimum speed selected to work for any possible fault tolerant reconfiguration of the reconfigurable hardware, a need is identified for estimating a worst-case propagation delay introduced by reconfiguring the resources to avoid the faulty resources, and adjusting the period of the system clock if required. In this manner, timing penalties caused by reconfiguration of the reconfigurable hardware for fault tolerant operation may be minimized. Preferably, such an approach to resource utilization would provide for a more gradual degradation of the adaptive computing system hardware, thus extending the useful life of the system while minimizing timing penalties caused by the fault tolerant reconfiguration of the system.

SUMMARY OF THE INVENTION

In accordance with a first aspect of the present invention, a method of fault tolerant operation of a field programmable gate array (FPGA) may be carried out during normal on-line operation and/or during off-line testing, for example, during manufacturing testing. More specifically, the method of operation of the field programmable gate array is carried out by configuring the FPGA resources into a working area and an initial self-testing area which preferably includes horizontal and vertical self-testing areas. The working area maintains normal operation of the FPGA throughout testing. During manufacturing testing, the working area may be replaced with additional self-testing areas or the self-testing area extended to include the entire FPGA. It should be noted that the same fault tolerant techniques described hereinafter for on-line testing may be used in part or in whole during off-line testing prior to reprogramming or re-configuring the FPGA for its intended normal operation.

Within the self-testing area, the programmable logic blocks and interconnect resources (collectively referred to as FPGA resources) are tested for faults and faulty FPGA resources identified. To test the FPGA resources in the present preferred embodiment, test patterns are generated by a test pattern generator and applied to the resources (e.g., equivalently configured programmable logic blocks or groups of interconnect resources) for testing. Outputs of the resources under test are preferably compared to outputs of other resources under test with an output response analyzer. Based on the comparison of the outputs of the resources under test, fault status data is generated.

When the fault status data indicates the detection of one or more faults within the resources under test, the resources may be repeatedly reconfigured and further tested until the faulty resource(s) is identified. Once identified, a determination is made whether the faulty resource is compatible with normal operation of the FPGA. If the faulty resource is not compatible, the FPGA resources are reconfigured to exclude or avoid the faulty resource. Preferably, initially unused resources of the FPGA are allocated as spares which may be utilized to replace a faulty resource when new configurations are determined. It is initially presumed that all of the resources of the FPGA are fault-free as determined through manufacturing testing.

In accordance with another aspect of the present invention, a propagation delay created by reconfiguring the signal path including the identified faulty resource is estimated. The estimated propagation or time delay may then be compared to a propagation delay of a critical path. As is well known by those skilled in the art, a critical path is a signal path having the longest propagation delay, i.e., the signal path which takes the longest amount of time for its signal to settle prior to initiating a next action. It should also be noted that the path determined to be the critical path may change as the self-testing areas rove around the FPGA under test.

Based on the comparison of the estimated propagation delay for the reconfigured signal path and the critical path propagation delay, a system clock period, i.e., the speed of the system clock, may be adjusted. In the present preferred embodiment, the system clock period is adjusted only if the estimated propagation delay is greater than the critical path propagation delay.

Upon completion of testing of each of the FPGA resources located within the initial self-testing area, reconfiguration to exclude faulty resources, and adjustment of the system clock, if required, the FPGA may be reconfigured so that a portion of the working area becomes a subsequent self-testing area, and at least one of the initial self-testing areas becomes a portion of the working area. In other words, the self-testing areas rove around the FPGA and the steps of identifying faulty FPGA resources, reconfiguring the resources for fault tolerant operation, and adjusting the system clock are repeated as required. Eventually, each portion of the working area, or the entire FPGA, is reconfigured as a subsequent self-testing area and its resources tested. Advantageously, normal operation of the FPGA continues within the working area uninterrupted by the testing and reconfiguring conducted within the self-testing areas.

In accordance with another aspect of the present invention, a method of fault tolerant operation of an adaptive computing system includes identifying a faulty logic or routing resource in a signal path of the adaptive computing system, reconfiguring the signal path to avoid the faulty resource, estimating a time delay created by reconfiguring the signal path, and adjusting a system clock period to accommodate the estimated time delay. The method may further include a comparison of the estimated time delay created by reconfiguring the signal path to a critical path time delay, and may require adjustment of the system clock period only if the time delay created by reconfiguring the signal path is larger than the critical path time delay. Preferably, actual timing data from the reconfigured signal path is utilized to determine the adjusted system clock period in place of the estimated time delay.

In accordance with still another aspect of the present invention, an apparatus for testing FPGA resources during normal on-line operation is provided. The apparatus includes a system clock and a test and reconfiguration controller each in communication with the FPGA. In operation, the test and reconfiguration controller accesses the FPGA during normal system operation and configures the FPGA into an initial self-testing area and a working area which maintains normal operation of the FPGA. Within the self-testing area, faulty FPGA resources are identified with one of a plurality of test configurations stored in an associated storage medium.

The test and reconfiguration controller further reconfigures the FPGA resources, or more specifically, the signal path wherein the identified faulty resource is located, to avoid the faulty resource and subsequently estimates a propagation delay created by reconfiguring the signal path. The estimated propagation delay of the reconfigured signal path may then be compared to a critical path propagation delay by the controller in order to calculate or determine the need to adjust a system clock period. In a preferred embodiment of the apparatus, actual timing data from the reconfigured signal path is utilized to calculate an adjusted system clock period and the system clock is only adjusted if the propagation delay is greater than the critical path propagation delay.

BRIEF DESCRIPTION OF THE DRAWINGS

The accompanying drawings incorporated in and forming a part of the specification, illustrate several aspects of the present invention and together with the description serve to explain the principles of the invention. In the drawings.

Reference will now be made in detail to the present preferred embodiment of the invention, an example of which is illustrated in the accompanying drawings.

DETAILED DESCRIPTION OF THE INVENTION

Figure 1:
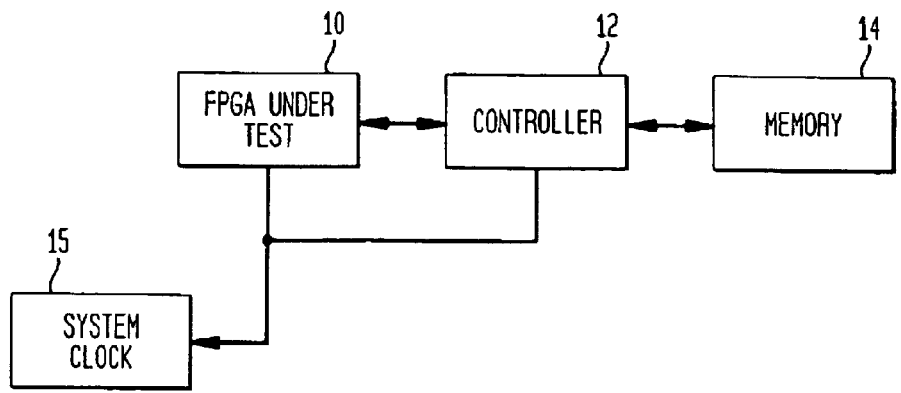
FIG. 1 is a schematic block diagram of an adaptive computing system including a field programmable gate array (FPGA)

With reference to the schematic block diagram of FIG. 1, there is shown a preferred embodiment of an adaptive computing system including a reconfigurable field programmable gate array (FPGA) 10 programmed for fault tolerant operation, a test and reconfiguration controller 12 and associated memory 14, and a system clock 15. A typical FPGA generally consists of an array of programmable logic blocks interconnected by a programmable routing network and programmable input/output cells or boundary-scan ports (most FPGAs feature a boundary-scan mechanism). Such structures are, for example, featured in the Lattice Semiconductor Corporation's ORCA Series FPGAs, in the Xilinx VIRTEX Series FPGAs, and in the ALTERA FLEX 8000 logic devices.

The present preferred method of fault tolerant operation of an FPGA during normal on-line operation is controlled by the test and reconfiguration controller 12. Most preferably, an external test and reconfiguration controller 12 is utilized because present commercially available FPGAs do not provide internal access to their configuration memory. Accordingly, a configuration decompiler tool of a type known in the art is utilized to determine the intended function or mode of operation of the FPGA resources. Alternatively, this information may be extracted from the design stage and made available to the controller 12. It should be appreciated by those skilled in the art that any controller, e.g., internal or external to an FPGA, could be utilized with an FPGA that allows for internal access to its configuration memory and that a single test and reconfiguration controller is capable of controlling several FPGAs. For purposes of illustration of the present preferred embodiment of the invention, however, a one-to-one controller to FPGA ratio is utilized.

Figure 2:
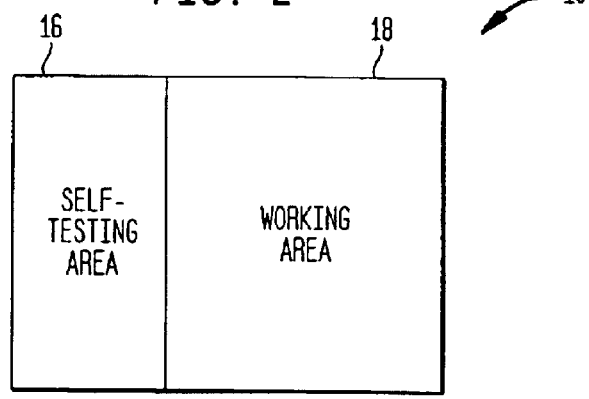
FIG. 2 is an illustration of an FPGA under test configured into a self-testing area and a working area which maintains normal operation of the FPGA under test.

The preferred controller 12 may be implemented on a microprocessor in communication with the storage medium or memory 14 for storing the various FPGA operational and test configurations, as well as, fault status data for the FPGA resources, or a standard piece of test equipment. In operation, the controller 12 accesses the FPGA under test 10 using its boundary-scan interface in a known manner such that access is transparent to normal function of the FPGA 10. Specifically, the controller 12 uses the boundary-scan interface to configure the FPGA resources, to initiate testing of the FPGA resources, and to scan out the test results. As shown in FIG. 2, the FPGA under test 10 is initially configured by the controller 12 into a self-testing area 16 which preferably includes independent vertical and horizontal self-testing areas, and a working area 18. In accordance with an important aspect of the present invention, normal operation of the FPGA under test 10 is maintained within the working area 18 while the FPGA resources are tested and faulty resources identified in the self-testing area 16. During manufacturing testing, the working area may be replaced with additional self-testing areas or the self-testing area extended to include the entire FPGA.

Figure 3:
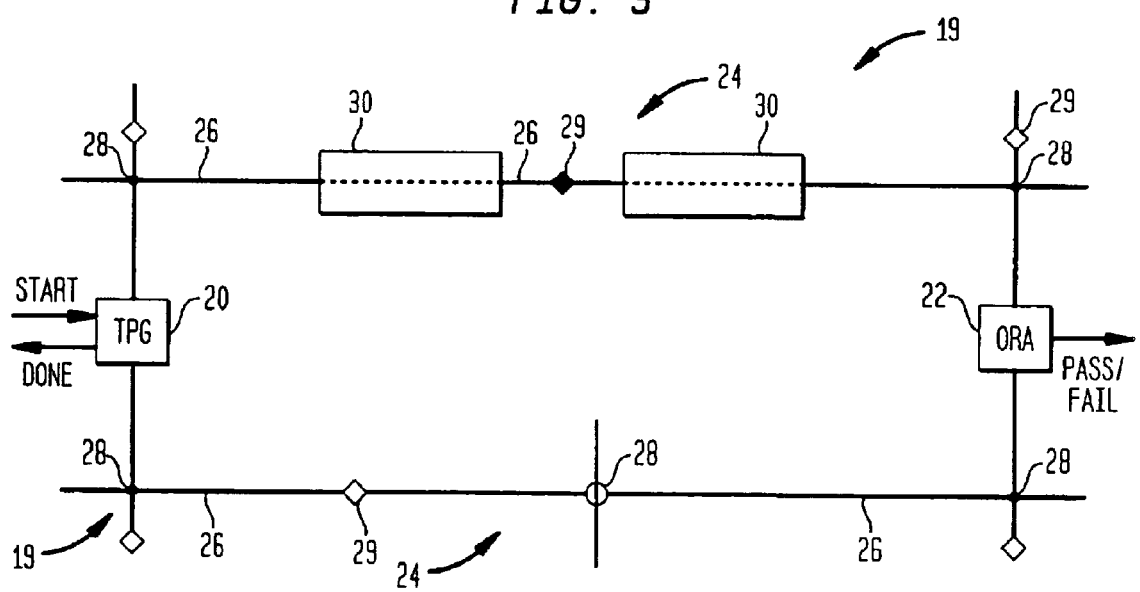
FIG. 3 is an illustration showing a preferred comparison-based tester configured to include a test pattern generator, an output response analyzer, and two groups of wires under test.

Testing of the programmable routing resources which make up the routing network of the FPGA under test 10 is generally accomplished by configuring its resources within the self-testing area 16 to function as a test pattern generator (TPG) 20 and an output response analyzer (ORA) 22, and as groups of wires under test (WUTs) 24. One possible example of this type of comparison-based tester is shown in FIG. 3 and is described in more detail below. During testing, an exhaustive set of equivalent test patterns generated using the TPG 20 is applied to and propagated along the groups of WUTs 24. Most preferably, the TPG 20 utilized to generate the exhaustive set of test patterns is configured as an n-bit counter. The groups of WUTs 24 may include wire segments 26, configurable or configuration interconnect points (CIPs) (including cross point CIPs 28 for connecting wire segments located in disjoint planes and break-point CIPs 29 for connecting wire segments in the same plane), and programmable logic blocks (PLBs) 30. Outputs of the groups of WUTs 24 are compared by the ORA 22 to determine whether a fault exists within either of the groups of WUTs 24. A match/mismatch result of the comparison performed by the ORA 22 is communicated as a pass/fail result or fault status data through the boundary-scan interface of the FPGA under test 10 to the controller 12. The fault status data is stored in memory 14 and utilized by the controller 12 in reconfiguring the FPGA resources for further testing and/or fault tolerant operation. The present preferred comparison-based on-line method of testing the programmable interconnect resources briefly described above including the fault model utilized and configuration of the self-testing area is described in detail in the above-referenced pending U.S. application Ser. No. 09/406,219 and in C. Stroud ET AL., *Built-In Self-Test of FPGA Interconnect*, PROC. INTN'L TEST CONF., at 404–411, 1998, both incorporated herein by reference.

Once a group of WUTs 32 is identified as including a faulty programmable interconnect resource, the resources of the FPGA under test 10 within the self-testing area 16 are reconfigured for further testing in order to minimize a region of the group of WUTs which includes the faulty interconnect resource. Once the region of the WUTs is minimized and the wire identified, a variety of testing configurations may be adaptively utilized to identify the faulty interconnect resource within the faulty region of the wire. In order to more precisely identify which interconnect resource, i.e., which wire segment or configuration interconnect point (CIP), within the faulty region is faulty, further reconfiguration and comparative testing is required. The present preferred on-line method of identifying faulty programmable interconnect resources briefly described above is described in detail in the above-referenced pending U.S. application Ser. No. 09/994,299 incorporated herein by reference.

If a determination is made that the faulty routing resources are not compatible with the intended operation of the FPGA under test 10, then the FPGA under test, or more specifically, the signal paths containing the identified faulty resources are reconfigured to bypass the faulty interconnect resource for continued operation in a diminished capacity. It should be noted that during off-line testing, identified faulty resources may simply be marked as faulty in order to avoid future use. In scenarios where more than one faulty resource is identified, a model of the programmable interconnect network is modified to reflect the faulty status of the incompatible faulty resource before determining the compatibility of subsequent faulty resources. In other words, the steps of determining compatibility and modifying the model of the programmable interconnect network are repeated until the compatibility of each of the identified faulty resources is determined. As briefly mentioned above, a controller then initiates a multi-step reconfiguration process which attempts to minimize the effect of each reconfiguration on the overall performance of the FPGA under test 10. The present preferred method of reconfiguring the signal paths containing the identified faulty interconnect resources to bypass the faulty resources briefly described above is described in detail in the above-referenced pending U.S. application Ser. No. 10/189,640 incorporated herein by reference.

Figure 4:
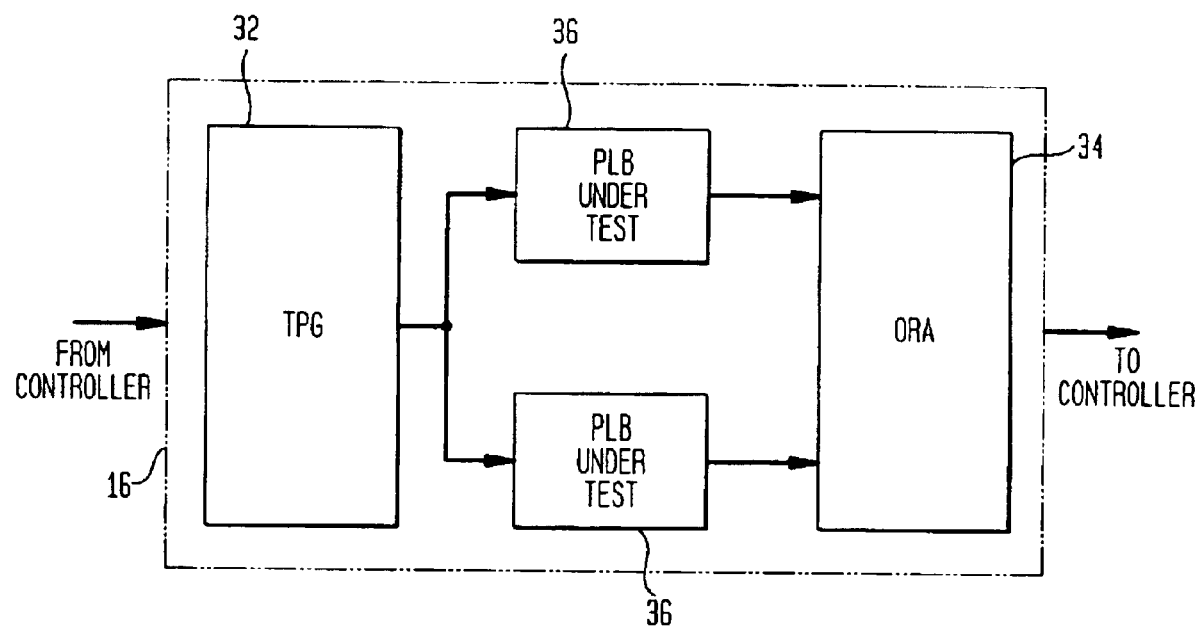
FIG. 4 is a schematic block diagram showing a preferred comparison-based tester configured to include a test pattern generator, an output response analyzer, and programmable logic blocks under test.

Similar to testing of the interconnect resources, testing of the programmable logic blocks of the FPGA under test 10 is generally accomplished by configuring its resources within the self-testing area 16 to function as a test pattern generator (TPG) 32, an output response analyzer (ORA) 34, and equivalently configured programmable logic blocks (PLBs) under test 36. One possible example of this type of comparison-based tester is shown in FIG. 4 and is described in more detail below. During testing, equivalent test patterns generated using the TPG 32 are received by the PLBs under test 36. The outputs of the PLBs under test 36 are compared by the ORA 34 to determine whether a fault exists within either of the PLBs under test. A match/mismatch result of the comparison performed by the ORA 34 is communicated as a pass/fail result or fault status data through the boundary-scan ports of the FPGA under test (not shown) to the controller 12.

Complete testing of the PLBs under test 36 is achieved by repeatedly reconfiguring the PLBs under test for testing in every possible mode of operation and applying exhaustive test patterns in each mode of operation. Without having a detailed knowledge of the implementation of the FPGA under test 10, the modes of operation of its programmable logic blocks may be determined only from the information provided in an associated FPGA data manual. In addition to repeatedly reconfiguring the PLBs under test 36, the TPG 32 is reconfigured by the controller 12 for each new mode of operation of the PLBs under test which require test patterns different from the ones generated for the previous mode of operation. The ORA 34 is also reconfigured by the controller 12 when the new mode of operation of the PLBs under test 36 involves a different number of outputs. The present preferred comparison-based on-line method of testing the programmable logic blocks briefly described above is described in detail in the above-referenced pending U.S. application Ser. No. 09/405,958 incorporated herein by reference.

When the fault status data indicates the detection of a fault in one of the PLBs 30, roving of the self-testing areas is initially interrupted in order to identify the faulty PLB and its faulty modes of operation. Specifically, the initial self-testing area wherein the faulty PLB lies is reconfigured for further testing in order to identify the faulty PLB. Preferably, the FPGA resources contained within the initial self-testing area are subdivided for inclusion with known fault-free PLBs for further testing in the manner described above.

Dependent upon the subsequent test results, the FPGA resources may be further reconfigured or subdivided and tested until the initially detected faulty PLB is identified. The present preferred method of identifying a faulty programmable logic block briefly described above is described in detail in the above-referenced pending U.S. application Ser. No. 09/617,853 incorporated herein by reference.

If a determination is made that the faulty PLBs are not compatible with the intended operation of the FPGA under test 10, then the FPGA under test, or more specifically, the signal paths containing the identified faulty PLBs are reconfigured to bypass the faulty PLBs for continued operation in a diminished capacity. More specifically, a portion of the working area PLBs are initially allocated as spares having fault tolerant replacement configurations predetermined or precompiled before the mission starts for each associated PLB. Preferably, the initially allocated spares and their associated precompiled replacement configurations are utilized first in an incremental reconfiguration process, if possible. If the number or location of unusable faulty PLBs is such that the initially allocated spares cannot replace the faulty PLBs, then a subsequent portion of the working area PLBs are allocated as spares and new fault tolerant replacement configurations computed. Although the initial precomputed replacement configurations are preferred over the new replacement configurations due to time considerations, the additional time required to reallocate subsequent spares and compute new replacement configurations does not significantly interfere with the continuing operation of the FPGA since normal operation of the FPGA continues within the working area throughout testing. The present preferred method of reconfiguring the signal paths containing the identified faulty PLBs to bypass the faulty PLBs briefly described above is described in detail in the above-referenced pending U.S. application Ser. No. 09/611,449 incorporated herein by reference.

Once a determination is made that the faulty FPGA resources are not compatible with an intended operation of the FPGA and the signal paths containing the identified faulty resources require reconfiguration to bypass the faulty resources, a time or propagation delay $\Delta T_{Prop}$ created by reconfiguring the signal paths is estimated by the controller 12. Based on the estimated propagation delay $\Delta T_{Prop}$, a system clock period T may be adjusted to accommodate the delay. Adjusting the system clock period T only when required, as opposed to initially establishing and operating the system clock 15 at a minimum speed selected to work for any possible fault tolerant reconfiguration, minimizes timing penalties caused by reconfiguration of the FPGA under test 10 for fault tolerant operation. Advantageously, this approach provides for a more gradual degradation of the FPGA under test 10 at the highest possible operating speeds.

In accordance with an important aspect of the preferred method, the estimated propagation delay $\Delta T_{Prop}$ of the reconfigured signal path is compared to a propagation delay of a critical path $\Delta t_{Critical}$ of the FPGA under test 10 by the controller 12 in order to determine the need to adjust the system clock period T. As indicated above, the critical path is the signal path having the longest propagation delay, i.e., the signal path which takes the longest amount of time for its signal to settle prior to initiating a next action, and may change throughout operation of the FPGA under test 10. For example, the critical path may be split by the self-testing areas 16 one, two, or more times if the critical path folds back on itself. In the event that the critical path is changed whether for fault tolerant operation of the FPGA under test 10 or by reconfiguration of the self testing areas 16, signal paths in the critical path are first considered to see if their estimated propagation delays $\Delta t_{Prop}$ change the propagation delay of the critical path $\Delta t_{Critical}$. Accordingly, changed signal paths are reviewed to determine if a new critical path is created by the reconfiguration. In the present preferred embodiment, the system clock period T is adjusted only if the estimated propagation delay $\Delta t_{Prop}$ is greater than the critical path propagation delay $\Delta t_{Critical}$.

In order to estimate the propagation delay $\Delta t_{Prop}$ in the present preferred embodiment, a generic model which can be mapped to most commercially available FPGA architectures is used to represent FPGA architectures that have multi-length, programmable interconnect segments. The model is based on an N×N array of PLBs. The PLBs are connected through a programmable interconnect network made up of N horizontal and N vertical wiring channels. Each wiring channel is composed of a number of wiring segments. The wiring segments can have different lengths, and each segment length is described using a parameter xi, where i=1 describes a distance spanning two adjacent PLBs and i is an element of a set of possible segment lengths, SL. The elements in the set SL are defined by the FPGA manufacturer, and SL varies from FPGA architecture to architecture. For example, SL={1, 4, N/2, N} for an ORCA2C architecture which is used in the present preferred embodiment of the invention.

As indicated above, each wiring channel is composed of sets of wiring segments. The segments in each set all have the same length and the sets are numbered from 1 to n, where n is the number of elements in the set SL. Relative to interconnect delays, a delay through a configurable or configuration interconnect point (CIP), such as a cross point CIP for connecting wire segments located in disjoint planes and a break-point CIP for connecting wire segments in the same plane, is defined as $D_{pip}$.

As stated earlier, the length and type of interconnects described by the generic model is dependent on the FPGA manufacturer and the specific FPGA device. The type and length of some commonly found representative programmable interconnects are generically categorized below. One such interconnect is a direct connection which is capable of supporting high speed logic chaining for applications like addition and counting. This type of connection is supported in most FPGA architectures and its delay is defined as $D_{chain}$. Another interconnect is a direct connection between outputs of a first PLB and inputs of a second adjacent PLB and its delay is defined as $D_{dir}$. It should be noted that external switch delays required for this connection may be lumped in with the delay of the segments used for this connection. Last, there are several lengths of routing segments based on a minimum distance between switch matrices. The delay of these segments is defined as $D_{xi}$, where i is a multiple of the minimum distance between switch matrices. Last, the delay between an I/O of a PLB and each type of connecting segment is lumped into the delay $D_{pinxi}$, where i∈SL.

In the present preferred embodiment of the inventive method, delays through CIPs are assumed to dominate delays through shorter segments, and excess delay is assumed to be introduced with every CIP. For the upper bound or worst-case estimated propagation delay $\Delta t_{Prop}$, it is further assumed that the shortest length segments requiring the most CIPs will be used in reconfiguring the signal paths containing the identified faulty resources. In other words, the shortest length wiring segments will be used to circumvent the faulty resources.

In datapath circuits, time delays are usually dominated by propagation delays of adders or counters. Many FPGA manufacturers have attempted to minimize these delays by introducing specialized high speed connections between PLBs, for example, high speed carry chaining between PLBs. Thus, the critical path of a specific circuit often includes many such chained connections. If any of these direct connections are split and rerouted using alternative routing segments, additional delays are introduced in the critical circuit path.

The present preferred method of estimating a reconfiguration propagation delay $\Delta t_{Prop}$ using the generic model described above will now be described for one specific example wherein chained direct connections, described immediately above, are split and additional FPGA resources utilized to reconfigure the initial chained direct connection to avoid the identified faulty resources. It should be appreciated by those skilled in the art that the methods described herein may simply be extended to all types of routed signal connections found in FPGAs and other reconfigurable hardware.

The delay $\Delta t$ of a signal routed through a programmable interconnect network of an FPGA is based on the number of wiring segments, the length of the wiring segments, and number of programmable switches in the signal's path. In order to estimate a change in delay or the propagation delay $\Delta t_{Prop}$ in the present preferred embodiment of the invention, several assumptions are used. The assumptions are that interconnect delays are dominated by the delay of the CIPs, I/O pins are available on each side of PLBs, delays for horizontal interconnects are the same as delays for corresponding vertical interconnects, and that changes in delay due to moving PLB functions are additive.

Using the generic model and assumptions set forth above, an upper bound propagation delay $\Delta t_{Prop}$ introduced to a critical path when the distance between two logic cell functions, i.e., two PLBs, in the critical path is changed may be estimated. The upper bound provides a worst-case estimate which is used to reduce the speed of the system clock or adjust the system clock period T due to reconfiguration of the FPGA under test 10 for fault tolerant operation. It should be noted that before the system clock period T is actually adjusted for fault tolerant operation, an actual propagation delay is determined using actual timing data from the routed circuit for use in adjusting the period. Additionally, if a logic cell function in a PLB in the middle of a chain is moved to a fault tolerant spare PLB location, the procedure must be used twice to estimate the additional path delay.

In the following examples, $\Delta X$ and $\Delta Y$ represent distances between two PLBs in the x-axis and y-axis directions, respectively. For each break between PLBs in a circuit critical path, an upper bound for the change in the critical path delay $\Delta t_{Critical}$ (shown as $D_{NEW}$ in the drawing Figure) is estimated in accordance with the flowchart set forth in FIG. 5.

Figure 5:
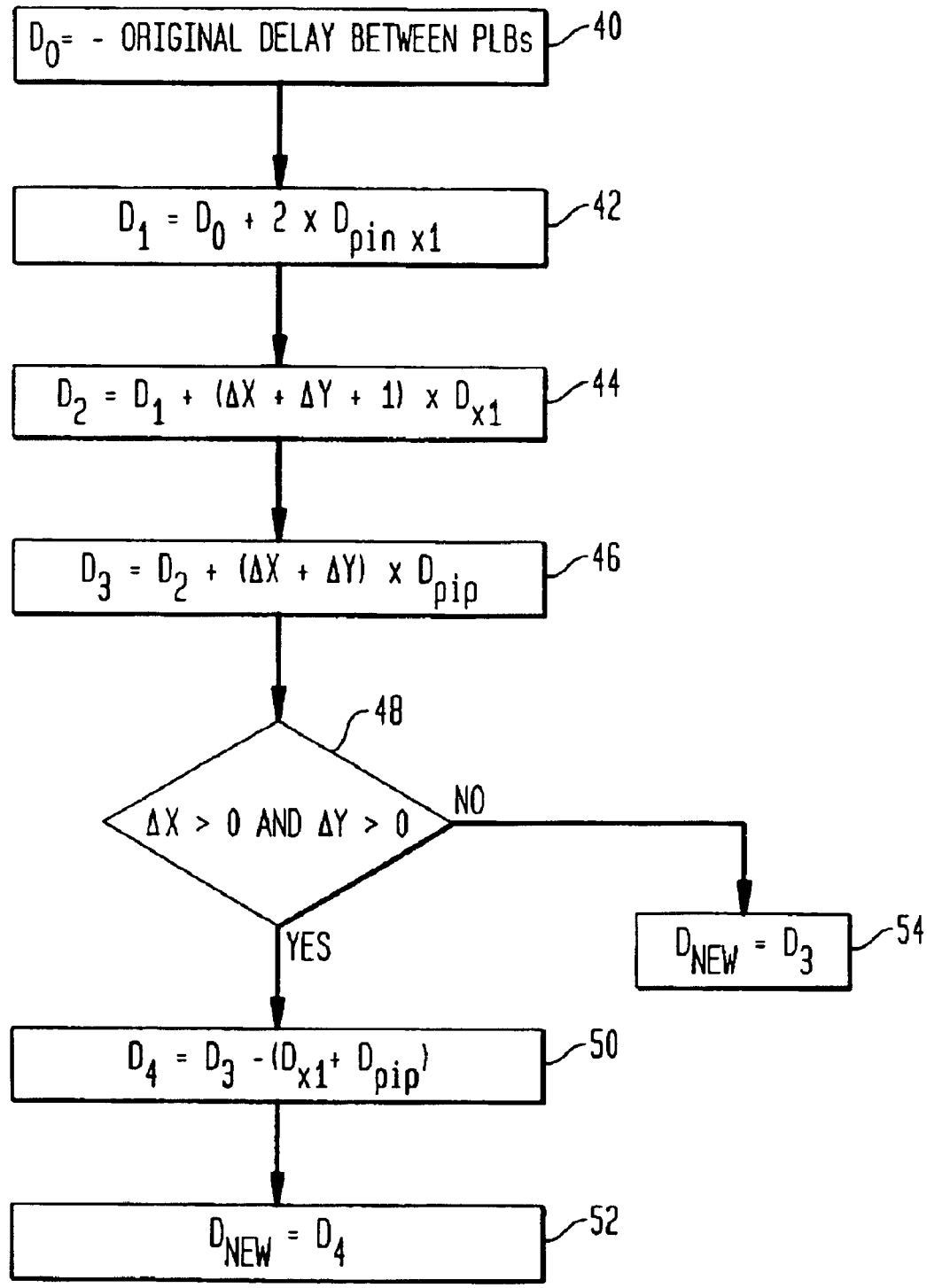
FIG. 5 is a flow chart of the algorithm used to estimate a worst-case propagation delay $\Delta T_{Prop}$ due to reconfiguration of a signal path for fault tolerant operation.
Figure 6:
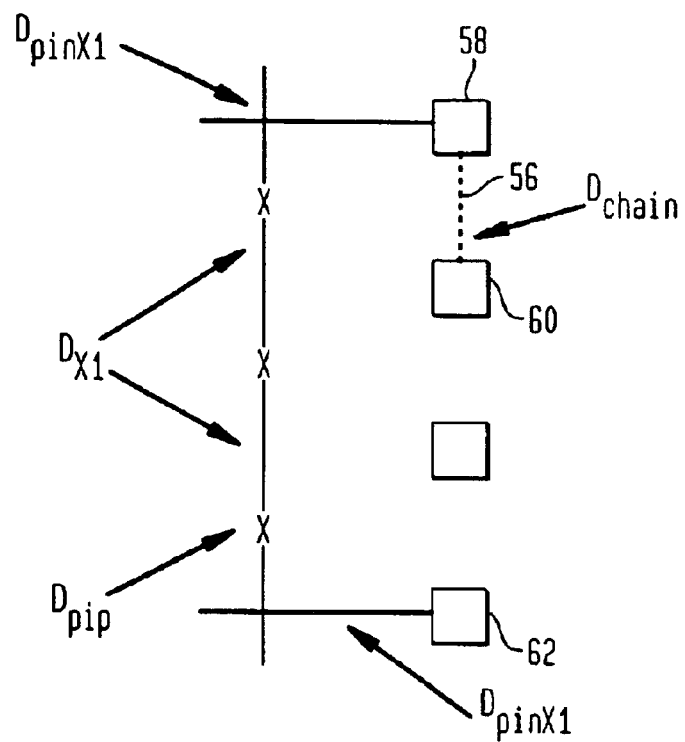
FIG. 6 is a schematic block diagram showing a one-axis split in a chained connection.

In order to illustrate the present preferred method of estimating time delays, an example of a one-axis split is shown in FIG. 6 and described below. If the signal initially routed through the fast chained connection 56 is in the critical path before and after the move, the worst case performance degradation due to the move may be estimated using the above-described procedure. As shown in FIG. 6, the initially chained connection between PLB 58 and PLB 60 is broken by moving the function of PLB 60 to PLB 62 for fault tolerant operation. In order to estimate the worst case time delay, $\Delta X$ is set to 0 and $\Delta Y$ is set to 3. This gives $D_{NEW} = 2 \times D_{pin \times 1} + 4 \times D_{x1} + 3 \times D_{pip} - D_{chain}$, wherein $2 \times D_{pin \times 1}$ comes from box 42, $4 \times D_{x1}$ comes from box 44, $3 \times D_{pip}$ comes from box 46, and $-D_{chain}$ comes from box 40. Since $\Delta X$ and $\Delta Y$ are not both greater than zero in this example, box 50 of FIG. 5 is not utilized, rather the result is set forth in box 54.

Figure 7:
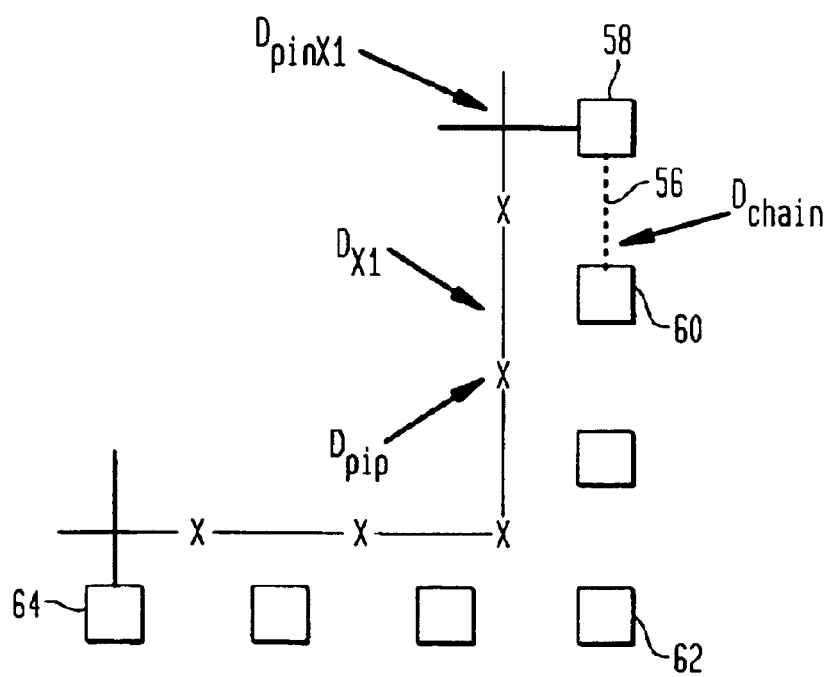
FIG. 7 is a schematic block diagram showing a dual-axis split in a chained connection.

Similarly for the example shown in FIG. 7 wherein a two-axis split is shown and $\Delta X$ is set to 3 and $\Delta Y$ is set to 3, the propagation delay becomes $D_{NEW} = 2 \times D_{pin \times 1} + 6 \times D_{x1} + 5 \times D_{pip} - D_{chain}$, where $2 \times D_{pin \times 1}$ comes from box 42, $7 \times D_{x1}$ comes from box 44, $6 \times D_{pip}$ comes from box 46, $-(D_{x1} + D_{pip})$ comes from box 50, $-D_{chain}$ comes from box 40, and $D_{NEW}$ comes from block 52. These examples can also be used to predict the worst-case effect on performance of splitting a system function by one or both of the roving self-testing areas, respectively.

In order to test and verify the above-described worst-case estimator, the effect on system clock speed of moving system logic cell functions to fault tolerant spare locations was simulated. In the simulation, direct connected logic cell functions in PLBs in the application critical path(s) were selected and moved to allocated spare locations at various distances from their original locations. The time delay estimates determined using the upper bound estimation procedure were compared to an actual change in the system clock speed. The parameters for the model used in the upper bound delay estimator can be determined using manufacturing data, or simply backed out of static timing analysis for specifically routed test circuits. The data in Tables 1 and 2 below show the values which were determined for the parameters in the upper bound delay estimator for the ORCA2C FPGA.

TABLE 1

Delay statistics
ΔDelay Statistics for the ORCA2C FPGA (ns)

| $D_{chain}$ | $D_{dir}$ | $D_{pip}$ |
|---|---|---|
| 0.5 | 1.5 | 1.3 |

TABLE 2

Delay statistics for pins and segments
ΔDelay Statistics for the ORCA2C FPGA (ns)

| | i = 1 | i = 4 | i = 10 | i = 20 |
|---|---|---|---|---|
| $D_{x1}$ | 0.2 | 0.8 | 2.0 | 4.0 |
| $D_{ptnx1}$ | 1.0 | 1.3 | 1.6 | 1.6 |

Table 3 below further shows the actual maximum system clock speed ($S_{max}$) as determined by TRACE and the upper bound estimation and percent difference for moving a logic cell function in the critical path to a spare location various distances ($\Delta M$) from its original location. The original maximum clock speed of the circuit was 7.54 MHz. For this data, the upper bound estimate is a conservative estimate for how much the clock speed of the system function should be decreased. However, this is only an estimate and the actual speed should reflect post-route timing data. Our estimation techniques are for use in a cost function for fault tolerant incremental reconfiguration of circuit placement.

TABLE 4

Comparison of the Actual Clock Speed to an Estimated Clock Speed
Clock Speed Prediction Results

| ΔM | $S_{max}$ (MHz) | $S_{upper}$ (MHz) | % diff |
|---|---|---|---|
| 1 | 7.44 | 7.90 | 6.0 |
| 2 | 7.41 | 7.11 | −4.1 |
| 3 | 6.89 | 6.97 | 1.2 |
| 4 | 7.17 | 6.82 | −5.0 |
| 5 | 7.06 | 6.55 | −7.5 |
| 6 | 7.01 | 6.42 | −8.8 |
| 7 | 6.95 | 6.31 | −9.7 |
| 8 | 6.72 | 6.19 | −8.2 |

Upon completion of testing of each of the FPGA resources located within the initial self-testing area 16, the FPGA under test 10 is reconfigured such that the functions of the resources forming a portion of the working area are copied to the resources forming the initial self-testing area 16. Once completed, the copied portion of the working area becomes a subsequent self-testing area. Preferably, the initial self-testing area 16 is reconfigured as an adjacent portion of the working area 18, i.e., the programmed function of an adjacent portion of the working area 18 is relocated, or more specifically copied, to the initial self-testing area 16 and the adjacent portion of the working area is reconfigured as the subsequent self-testing area 38. The present preferred method of roving the self-testing areas and reconfiguring the FPGA under test 10 are described in complete detail in U.S. application Ser. No. 09/405,958 incorporated herein by reference.

In summary, the method of fault tolerant operation of an adaptive computing system includes the steps of identifying at least one faulty FPGA resource in a signal path of the adaptive computing system, reconfiguring the signal path to avoid the at least one faulty resource, estimating a time delay created by reconfiguring the signal path, and adjusting a system clock period T to accommodate the time delay. In the present preferred embodiment, the adaptive computing system includes an FPGA initially configured into a working area and initial self-testing areas. The working area maintains normal operation of the FPGA throughout testing. Within the initial and subsequent self-testing areas, however, the FPGA resources are tested and faulty resources identified. The FPGA is then reconfigured to avoid the identified faulty resources for fault tolerant operation. A time delay created by reconfiguring the signal is determined and a system clock period T may be adjusted to accommodate the time delay.

The foregoing description of a preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fault tolerant operation of a field programmable gate array during normal on-line operation comprising the steps of:
   configuring said field programmable gate array into an initial self-testing area and a working area, said working area maintaining normal operation of the field programmable gate array;
   identifying at least one faulty resource in a signal path of said self-testing area;
   reconfiguring said signal path to exclude said at least one faulty resource;
   estimating a propagation delay created by reconfiguring the signal path; and
   adjusting a system clock period if the estimated propagation delay is greater than a critical path propagation delay.

2. The method of fault tolerant operation of a field programmable gate array set forth in claim 1, wherein the step of identifying at least one faulty resource includes testing resources located within said initial self-testing area for faults.

3. The method of fault tolerant operation of a field programmable gate array set forth in claim 2, wherein said testing step includes establishing resources within said self-testing area as a test pattern generator, an output response analyzer, and equivalently configured programmable logic blocks under test, applying test patterns generated by said test pattern generator to said programmable logic blocks under test, comparing outputs of said programmable logic blocks under test with said output response analyzer, and producing fault status data for said programmable logic blocks under test.

4. The method of fault tolerant operation of a field programmable gate array set forth in claim 2, wherein said testing step includes establishing resources within said self-testing area as a test pattern generator, an output response analyzer, and at least two groups of wires under test, propagating test patterns generated by said test pattern generator along said at least two groups of wires under test, comparing outputs of said at least two groups of wires under test with said output response analyzer, and producing fault status data for said at least two groups of wires under test.

5. The method of fault tolerant operation of a field programmable gate array set forth in claim 1 further comprising allocating at least one resource of the field programmable gate array as a spare; and
   wherein the reconfiguring step includes determining a new configuration of at least the signal path determined to include the at least one faulty resource utilizing the at least one spare resource to replace the at least one faulty resource.

6. The method of fault tolerant operation of a field programmable gate array set forth in claim 1 further comprising the step of roving said initial self-testing area by reconfiguring said field programmable gate array such that a portion of said working area becomes a subsequent self-testing area and at least a portion of said initial self-testing area becomes a portion of said working area.

7. The method of fault tolerant operation of a field programmable gate array set forth in claim 1, wherein said initial self-testing area includes at least two self-testing areas.

8. The method of fault tolerant operation of a field programmable gate array set forth in claim 1 further comprising the step of comparing the estimated propagation delay created by reconfiguring the signal path to the critical path propagation delay.

9. The method of fault tolerant operation of a field programmable gate array set forth in claim 1 further comprising the step of calculating an adjusted system clock period using actual timing data from the reconfigured signal path.

10. The method of fault tolerant operation of a field programmable gate array set forth in claim 9, wherein the step of identifying at least one faulty resource includes testing resources located within said initial self-testing area for faults.

11. The method of fault tolerant operation of a field programmable gate array set forth in claim 10, wherein said testing step includes establishing resources within said self-testing area as a test pattern generator, an output response analyzer, and equivalently configured programmable logic blocks under test, applying test patterns generated by said test pattern generator to said programmable logic blocks under test, comparing outputs of said programmable logic blocks under test with said output response analyzer, and producing fault status data for said programmable logic blocks under test.

12. The method of fault tolerant operation of a field programmable gate array set forth in claim 10, wherein said testing step includes establishing resources within said self-testing area as a test pattern generator, an output response analyzer, and at least two groups of wires under test, propagating test patterns generated by said test pattern generator along said at least two groups of wires under test, comparing outputs of said at least two groups of wires under test with said output response analyzer, and producing fault status data for said at least two groups of wires under test.

13. The method of fault tolerant operation of a field programmable gate array set forth in claim 9 further comprising allocating at least one resource of the field programmable gate array as a spare; and wherein the reconfiguring step includes determining a new configuration of at least the signal path determined to include the at least one faulty resource utilizing the at least one spare resource to replace the at least one faulty resource.

14. The method of fault tolerant operation of a field programmable gate array set forth in claim 9 further comprising the step of roving said initial self-testing area by reconfiguring said field programmable gate array such that a portion of said working area becomes a subsequent self-testing area and at least a portion of said initial self-testing area becomes a portion of said working area.

15. The method of fault tolerant operation of a field programmable gate array set forth in claim 9, wherein said initial self-testing area includes at least two self-testing areas.

16. A method of fault tolerant operation of an adaptive computing system comprising the steps of:

identifying at least one faulty resource in a signal path of said adaptive computing system;

reconfiguring said signal path to avoid said at least one faulty resource;

estimating a time delay created by reconfiguring the signal path; and adjusting a system clock period to accommodate said estimated time delay.

17. The method of fault tolerant operation of an adaptive computing system set forth in claim 16 further comprising the step of comparing the time delay created by reconfiguring the signal path to a critical path time delay, and adjusting the system clock period if the time delay created by reconfiguring the signal path is larger than the critical path time delay.

18. The method of fault tolerant operation of an adaptive computing system set forth in claim 17 further comprising the step of determining an adjusted system clock period using actual timing data from the reconfigured signal path.

19. The method of fault tolerant operation of an adaptive computing system set forth in claim 17, wherein the adaptive computing system includes at least one field programmable gate array configured into an initial self-testing area and a working area, said working area maintaining normal operation of the field programmable gate array; and wherein the step of identifying at least one faulty resource includes testing resources within said initial self-testing area.

20. The method of fault tolerant operation of an adaptive computing system set forth in claim 17 further comprising allocating at least one resource of the adaptive computing system as a spare; and wherein the reconfiguring step includes determining a new configuration of at least the signal path determined to include the at least one faulty resource utilizing the at least one spare resource to replace the at least one faulty resource.

21. An apparatus for testing resources during normal on-line operation of a field programmable gate array comprising:

a system clock in communication with said field programmable gate array; and a controller in communication with said field programmable gate array (a) for configuring said field programmable gate array into an initial self-testing area and a working area, said working area maintaining normal operation of the field programmable gate array, (b) for identifying at least one faulty resource in a signal path of said self-testing area, (c) for reconfiguring said signal path to avoid said at least one faulty resource, (d) for estimating a propagation delay created by reconfiguring the signal path, and (e) for adjusting a period of said system clock if the estimated propagation delay is greater than the critical path propagation delay.

22. The apparatus for testing resources during normal on-line operation of a field programmable gate array set forth in claim 21, wherein said controller further compares the estimated propagation delay created by reconfiguring the signal path to the critical path propagation delay.

23. The apparatus for testing resources during normal on-line operation of a field programmable gate array set forth in claim 21, wherein the controller calculates the adjusted system clock period using actual timing data from the reconfigured signal path.

* * * * *